United States Patent [19]

Fillion et al.

[11] Patent Number: 4,718,019

[45] Date of Patent: Jan. 5, 1988

[54] ELECTION BEAM EXPOSURE SYSTEM AND AN APPARATUS FOR CARRYING OUT A PATTERN UNWINDER

[75] Inventors: Timothy I. Fillion, Burlington; Marc L. Bergeron, Bedford; Andrey Varpahovsky, Brookline, all of Mass.

[73] Assignee: Control Data Corporation, Minneapolis, Minn.

[21] Appl. No.: 749,644

[22] Filed: Jun. 28, 1985

[51] Int. Cl.[4] ............... H01J 37/00; G06F 15/40
[52] U.S. Cl. .................... 364/491; 364/490; 250/442.1; 250/398; 250/491.1
[58] Field of Search ............ 364/490, 491; 250/398, 250/396 ML, 307, 492.2, 442.1, 491.1

[56] References Cited

U.S. PATENT DOCUMENTS

| 3,491,236 | 1/1970 | Newberry | 250/307 |
|---|---|---|---|
| 4,063,103 | 12/1977 | Sumi | 250/442.1 |
| 4,200,794 | 4/1980 | Newberry et al. | 250/396 ML |
| 4,291,231 | 9/1981 | Kawashima et al. | 250/442.1 |
| 4,387,433 | 6/1983 | Cardenia et al. | 364/491 |
| 4,390,789 | 6/1983 | Smith et al. | 250/492.2 |
| 4,433,384 | 2/1984 | Berrian et al. | 364/525 |
| 4,465,934 | 8/1984 | Westerberg et al. | 250/398 |
| 4,511,980 | 4/1985 | Watanabe | 364/491 |
| 4,530,064 | 7/1985 | Takigawa et al. | 364/491 |
| 4,531,191 | 7/1985 | Koyama | 364/491 |

FOREIGN PATENT DOCUMENTS

WO84/01454  4/1984  PCT Int'l Appl. .............. 364/491

OTHER PUBLICATIONS

Sugiyama et al., "Data Processing System of Electron-Beam Lithography for VLSI Microfabrication", IEEE, vol. Ed-26, No. 4, Apr. 1979, pp. 675-685.
Lemmond, "Electron Fly's Eye Lens Artwork Camera", IEEE, vol. Ed-21, No. 9, Sep. 1974, pp. 598-603.
Speth et al., "Electron-Beam Lithography Using Vector-Scan Techniques", J. Vac. Sci. Technol., vol.12, No. 6, Nov./Dec. 1975, pp. 1235-1239.

Primary Examiner—Errol A. Krass
Assistant Examiner—V. N. Trans
Attorney, Agent, or Firm—Charles W. Helzer; Ira C. Edell

[57] ABSTRACT

In an electron beam system in which the beam is exposed in selected prescribed patterns on a target surface, stored pattern data specifies the location of the pattern as coordinates on the target plane of a reference point in the pattern, specifies the shape of the pattern as a code identifying one of several permissible shapes, and specifies the size of the pattern as dimensions of first and second pattern dimensions in the target plane. In exposing each pattern, the data is: modified to provide the selected pattern in the desired size; modified to determine the maximum beam size for the selected pattern; dynamically fragmented into individual beam flashes; and examined to determine the beam spot size, shape and position for each flash. All patterns are generally designated as trapezoids, with a triangle considered as a trapezoid having one side of zero length, a rectangle considered as a trapezoid having four right angles, etc.

15 Claims, 12 Drawing Figures

| SAMPLE UPDATE CHART | | | | | |
|---|---|---|---|---|---|
| SIDE | H(G) | L(BG) | L(TG) | dX | dY |
| LOAD | 5.0 | 8.5 | 3.5 | — | — |
| 1 | — | 7.5 | — | +1 | +1 |
| 2 | — | — | — | +1 | 0 |
| 3 | 4.0 | 6.5 | — | 0 | −1 |
| 4 | — | — | — | −1 | 0 |
| 5 | 3.0 | 5.5 | — | +1 | +1 |
| 6 | — | — | — | +1 | 0 |
| 7 | 2.0 | 4.5 | — | 0 | +1 |
| 8 | — | — | — | −1 | 0 |
| 5 | 1.0 | 3.5 | — | +1 | +1 |
| 6 | — | — | — | +1 | 0 |

ELECTION BEAM EXPOSURE SYSTEM AND AN APPARATUS FOR CARRYING OUT A PATTERN UNWINDER

TECHNICAL FIELD

The present invention relates to improvements in scanned electron beam systems and, more particularly, to a method and apparatus for increasing the scanning efficiency of such systems.

BACKGROUND OF THE INVENTION

In electron beam lithography systems such as the system described in U.S. Pat. No. 4,390,789 (Smith et al), an electron beam is scanned to effect movement of the beam spot in a target plane. In the Smith et al system, in particular, the primary purpose of scanning the beam spot is to directly write circuit patterns on a reticle or semiconductor target wafer as part of the fabrication of microcircuit devices. In order to control beam deflection a relatively large amount of data, describing the pattern features to be written, must be prepared and supplied to the system. The preparation of such detailed data, describing substantially every point in the pattern to be traced, is quite time consuming. Moreover, the data processing is relatively complex, as well as time consuming.

A prior art approach to simplifying the input data requirements and resulting complexity of electron beam lithography systems is described in U.S. Pat. No. 4,433,384 (Berrian et al). In that system, data describing the various circuit patterns to be written are subdivided into blocks of segment figure data and stored in a pattern data memory. Multiple pattern generators, each including a bit map memory, simultaneously convert blocks of segment figure data into bit maps and store these bit maps in respective bit map memories. The bit maps are then used to provide continuous beam blanking data during a complete scan of the target area. The resulting system permits higher speed operation than was possible in prior art systems. However, input data for the system is still relatively complex. More importantly, the blanking approach requires the system to take the time required to scan the entire target area, even though the beam is selectively blanked during such scan under the control of the bit map. In other words, the beam must execute a complete raster scan, line by line, and is selectively blanked under the control of the derived bit map.

OBJECTS AND SUMMARY OF THE INVENTION

It is therefore an object of the present invention to provide a method and apparatus for simplifying the scanning procedure for an electron beam to define specified patterns in a target plane.

It is another object of the present invention to provide a method and apparatus for traversing prescribed pattern areas in a target plane with a focused spot of an electron beam without requiring detailed input data for each scan location and without requiring a complete line by line scan of the entire target area.

A further object of the present invention is to provide a method and apparatus for simplifying scanning of electron beams in predetermined patterns along a target plane in response to minimum input data defining only the general pattern type, the location of a pattern reference point in the target plane, the orientation of the pattern in that plane, and two dimensions of the pattern.

It is still another object of the present invention to increase the efficiency of scan electron beam systems by reducing the complexity and time requirements for the beam scan as well as the complexity and amount of data required to effect scans of predetermined generalized patterns which are large relative to the beam spot size.

In accordance with the present invention a multiplicity of stored pattern configurations are selectively identified by one part of a four-part input data code. Other parts of the input data code include the co-ordinates (x,y) of a predetermined reference point of the selected pattern in the target plane, the orientation (i.e. rotational position of the pattern), the height dimension (y) of the selected pattern, and the length dimension (x) of that pattern. The initial position, height and length perameters may be modified selectively by the system under the control of an operator. Upon receiving input data the system determines the appropriate stored pattern to be swept by the beam and controls the position and shape of the beam spot in the target plane to expose the specified pattern areas in that plane. Only the areas to be exposed are scanned (i.e. vector scan) as opposed to scanning the entire target plane (i.e., raster scan). In order to simplify input data requirements, all patterns are defined generically as trapezoids, with a triangle considered to be a degenerate form of trapezoid having one side of zero length, a rectangle considered to be a trapezoid having four right angles, etc.

The primary component of the present invention is a flash generator which converts each pattern feature into a series of shaped beam spot flashes. These flashes are organized as sides in the selected pattern, a side being defined as a step or series of steps in a common direction (x or y). The flash generator employs eight different types of sides to convert a pattern feature into flashes. Sides one through four outline the feature periphery; sides five through eight are used (repeatedly, if necessary) to fill in the core of the feature. By outlining the feature with sides one through four, all spot shape selection is implemented on those sides, thereby facilitating treatment of the boundary differently than the core of the feature (i.e., smaller spot size, or unique dwell time).

The flash generator is designed to interpret trapezoidal pattern features, defined by a four-bit code in the header word of the feature record portion of the input data. As used in the context of the present invention, generic trapezoidal patterns include triangles, rectangles and parallelagrams as well as the more commonly recognized trapezoids, with angles limited to forty-five or ninety degrees. As noted above, a triangle is interpreted as a trapazoid with either the top or bottom side having a zero length; thus, in exposing a triangular feature, either side two or side four is omitted from the scan.

The flash generator can interpret pattern features with either an x orientation (i.e., parallel sides are parallel to the x axis) or a y orientation (i.e., the parallel sides are parallel to the y axis). Triangles and rectangles can be arbitrarily assigned as having x or y orientation. An x orientation starts with a reference point at the lower left corner of the pattern which is formed by directing the beam clockwise to outline the feature. A feature with y orientation is referenced to the right lower corner of the feature and the sides are formed in a counter clockwise direction.

Although the description set forth herein relates the present invention to electron beam lithography systems for forming circuit patterns on a semiconductor wafer, the invention has broader utilization in substantially any scan electron beam system in which it is desire to scan a beam spot over selected pattern areas in a target plane. For example, scanned electron beams have recently been employed in inspection applications in which particular pattern areas are scanned. It is to be understood that the principles of the present invention are equally applicable to those applications.

BRIEF DESCRIPTION OF THE DRAWINGS

These and other objects, features and many of the attendant advantages of this invention will be appreciated more readily as the same become better understood from a reading of the following detailed description, when considered in connection with the accompanying drawings, wherein like parts in each of the several figures are identified by the same reference characters and wherein.

DESCRIPTION OF THE PREFERRED EMBODIMENTS

Figure 1:
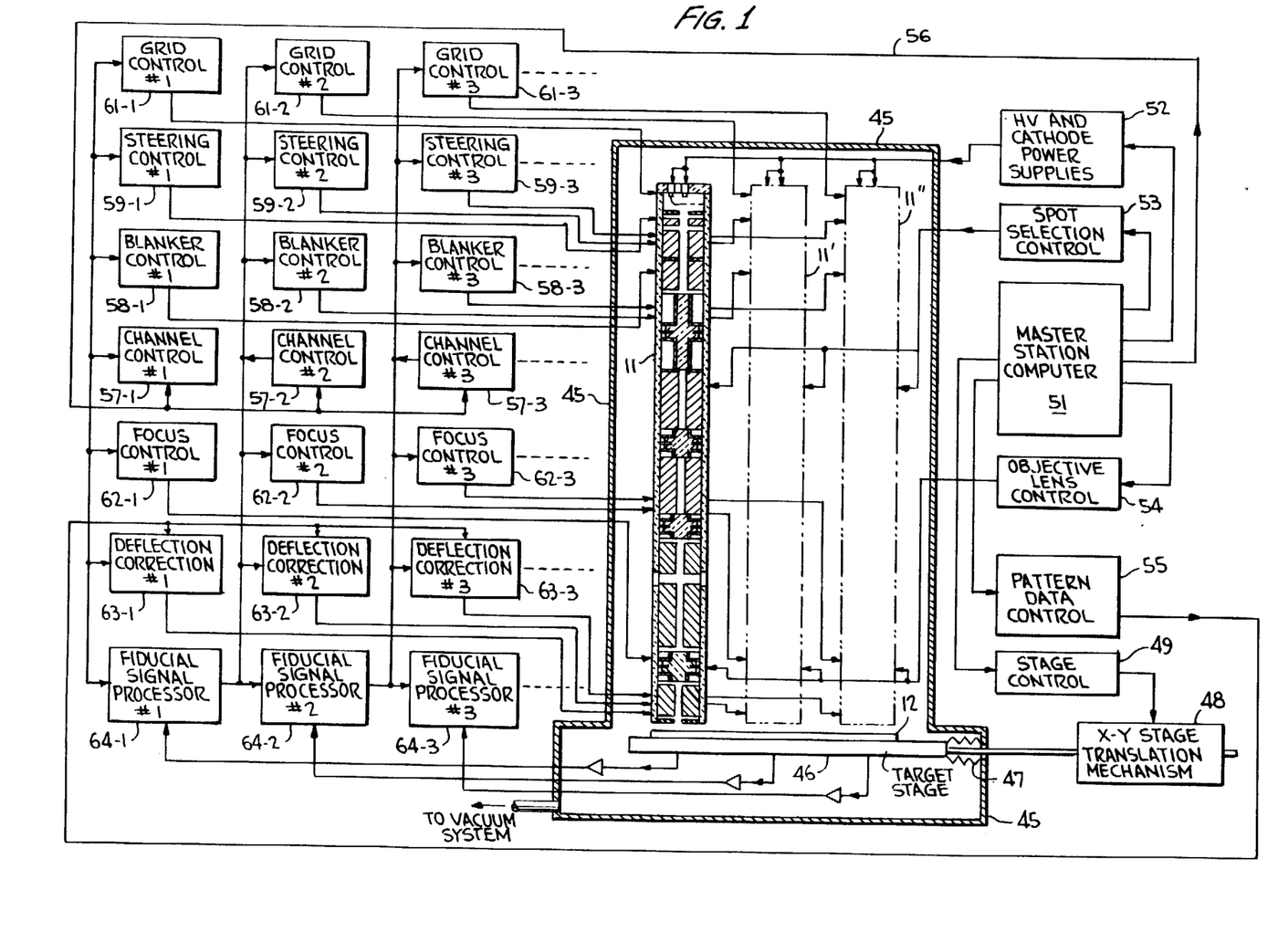
FIG. 1 is a functional block diagram illustrating the pattern data control unit of the present invention employed as part of an overall control system used for controlling a multiple channel electron beam optical column lithography system station in accordance with the present invention.

Referring specifically to FIG. 1 of the accompanying drawings, illustrated therein is a functional block diagram of a suitable control system for a multiple electron beam lithography system and is provided in order to illustrate the manner in which the pattern data control unit 10 of the present invention is employed. The control system of FIG. 1 is illustrated and described in co-pending U.S. patent application Ser. No. 06/749,796, filed concurrently with the present application and entitled "Multiple Channel Electron Beam Optical Column Lithography System And Method Of Operation" by Kenneth J. Harte. The subject matter of that application is expressly incorporated herein in its entirety by this reference. The only difference between the two systems resides in the fact that the pattern dependent deflection control unit 55 of the Harte application is replaced by the pattern data control unit 10 of the present invention. In addition, the spot selection control unit 53 of the Harte application is controlled by the pattern data control unit 10 in the present invention rather than by direct control from the master station computer. A detailed discussion of the components and operation of the control system of FIG. 1 is omitted from the present description in view of the description provided in the Harte patent application.

Figure 2:
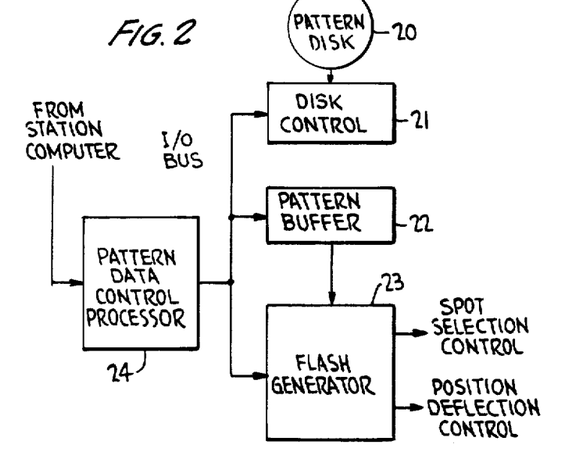
FIG. 2 is a functional block diagram of the pattern data control unit of the present invention.

Referring specifically to FIG. 2 of the accompanying drawings, the pattern data control unit is a subsystem of the electron beam lithography system for which the control subsystem portion is illustrated in FIG. 1. The functions of the pattern data control unit are to access pattern data files, interpret the feature records, and control the position and shape of the beam spot to expose the specified areas of the target. The unit is configured as an intelligent peripheral, receiving high level exposure commands from the master station computer 11 which supervises the entire system. The pattern data control unit includes a pattern disc 20 which is the storage medium for the patent data files to be exposed. A disc controller 21 is a standard product which interfaces between the disc and and I/O Bus. The I/O Bus, in the preferred embodiment, is a Data General NOVA I/O Bus. A pattern buffer 22 is a four bank ring counter memory. Each bank accepts an entire sixteen K Byte block from the disc controller. Once a bank is filled, its pattern data becomes available for access and exposure by the flash generator. Once a bank has been emptied by the flash generator, a new block may be loaded into the bank from the disc controller 21.

The flash generator 23, which is the essence of the present invention, interprets feature records in the pattern data file and produces the required control signals representing beam spot position and beam spot shape to expose the defined pattern. A pattern data control processor 24 controls the flow of pattern data from pattern disc 20 to the pattern buffer 22. Processor 24 must monitor the full/empty status flags at the pattern buffer 22. If a bank is available, the processor 24 commands the disc controller to access the next pattern block and transfer it to the pattern buffer 22. The pattern data processor 24 also determines the sequence and number of block accesses.

Before describing the individual components of the flash generator in detail, the following description of the basic operating principles of the system is provided in order to facilitate an understanding of the subsequent description of the hardware components.

The flash generator receives an input signal comprising a coded time-sequence representation of fifteen elementary shapes comprising triangles and quadrilaterals. The flash generator operates upon the input data so as to provide the required beam spot deflection instructions to produce the desired final pattern at the selected target areas. Generally, the input data is provided on magnetic tape in accordance with a prescribed protocol. The tape must be translated off-line into an acceptable format which is a time sequence of data defining a two-dimensional array of triangles and quadrilaterals. The input data to be translated describes the total area pattern of the target. This pattern must be broken up, or fractured, into data for a succession of nine-by-nine lenslet areas. The data for each lenslet area is also broken up, or fractured, into data for a succession of sixteen-by-sixteen subfield areas. The pattern data for each subfield is then broken up into simple triangles or quadrilaterals. Exposing these triangles and quadrilaterals in time sequence creates the desired subfield pattern on the work piece in the target plane. The function of the flash generator is to accept this time-sequence data, which defines the elementary triangles and quadrilaterals, and to provide the necessary beam deflection data for inscribing the indicated shapes on the work piece.

The fractured input data is supplied to the pattern data control processor 24 from the master station computer 11 on magnetic tape in a form acceptable to processor 24. A tape source is too slow for the throughput requirements of the system; therefore, the data is stored on a magnetic Trapazoidal Disc as directed by a tape controller. The master station controller employs three different buses for effecting movement of the beam spot. A first bus moves the beam spot to the center of the area to be covered by one of the nine-by-nine lenslets. The second bus moves the beam spot to the center of one of the sixteen-by-sixteen subfields within the lenslet area, with switching correction. The third bus carries the data which moves the beam spot to successive locations within the subfield to expose elementary triangles and quadrilaterals onto the subfield area of the work piece. This bus receives its deflection data from flash generator 23 and is schematically represented by the two control signals designated "spot selection control" and "position deflection control".

The flash generator must operate at a sufficiently high speed to prevent stopping the exposure process for lack of beam deflection controls. Accordingly, the information on the Trapezoidal Disc 20 is taken from the disc by a Xylogic Controller 21, and the data is placed in a three-bank data buffer in a queue arrangement (first in, first out). Each bank is capable of holding deflection data for an entire lenslet. This assures that exposure continues without having to stop for lack of data. A fourth bank is reserved to store lenslet data in case of a faulty lenslet. In such a case, the work piece mechanical stage is moved to bring the work piece area corresponding to the faulty lenslet into a position which can be exposed through an operative lenslet. After this operation the mechanical stage moves back to its next intended position for exposure of the next lenslet.

Input data supplied to the flash generator defines each shape to be exposed in terms of four sixteenbit words. These four words contain the complete information for each shape and include: (1) a shape identification word; (2) a location word indicating the co-ordinates (x,y) of the reference corner for the indicated pattern; (3) the height of the pattern (dy); and (4) the length of the pattern (dx).

The shape identification word includes a classification code, an edge code, an orientation code and a shape code. The classification code is defined in bits twelve through fifteen to indicate whether or not the prescribed pattern is located at the end of a lenslet or subfield. The edge code is defined by bits eight through eleven and indicates whether or not any of the sides of the subject pattern abuts a side of another pattern in the target plane. The orientation code utilizes bits for four through seven and indicates whether or not the data is fractured. The shape code utilizes bits zero through three to identify the fifteen possible pattern shapes. More particularly, the binary value of the four shape code bits represents a number corresponding to a particular shape.

The orientation code is also employed to indicate whether the pattern has an x-orientation or a y-orientation. For an x-orientation, the reference corner is defined as the lowermost corner of the pattern. If there are two lowermost corners, the corner to the left is chosen as the reference point. If the co-ordinates (x,y) define this point for y-orientation, the reference corner is taken as the leftmost corner of the shape. If there should be two leftmost corners, the lower corner is chosen as the reference.

With x-orientation, four-sided shapes always have their upper and lower sides parallel to the x-axis. The remaining sides may be at angles of forty-five degrees, ninety degrees or one-hundred and thirty-five degrees with respect to the x-axis and need not be parallel to one another. This limits the four-sided shape to a square, a rectangle, or some form of trapezoid. The distance dy is always the vertical distance between the two sides which are parallel to the x-axis. The distance dx is always the length of the side leading to the right from the reference corner. With x-orientation a triangle always has one side parallel to the x-axis and an apex above or below that side. The distance dy is always the vertical distance between the apex and the side parallel to the x-axis. The distance dx is determined according to the position of the reference corner. If the reference corner is at one end of the side parallel to the x-axis, then dx is the length of this side. If the reference corner is at the apex of the triangle, then dx=zero and the length of the side parallel to the x-axis is calculated from the value of dy and a knowledge of the shape of the pattern.

With y-orientation, four-sided shapes always have their right and left sides parallel to the y-axis. Upper and lower sides may be at angles of forty-five degrees, ninety degrees, or one-hundred and thirty-five degrees with respect to the y-axis and need not be parallel to one another. This limits the four-sided shape to a square, a rectangle or some form of trapezoid. The distance dx is always the horizontal distance between the two sides which are parallel to the y-axis. The distance dy is always the length of the side leading upward from the reference corner.

With y-orientation, a triangle always has one side parallel to the y-axis and an apex extending to the right or left of this side. The distance dx is always the horizontal distance between the apex and the side parallel to the y-axis. The distance dy is determined in accordance with the position of the reference corner. If the reference corner is at one end of the side parallel to the y-axis, then the distance dy is the length of this side. If the reference corner is at the apex of the triangle, then the distance dy equals zero and the length of the side parallel to the y-axis may be calculated from the value of dx and a knowledge of the shape of the pattern.

Figures 10, 12:
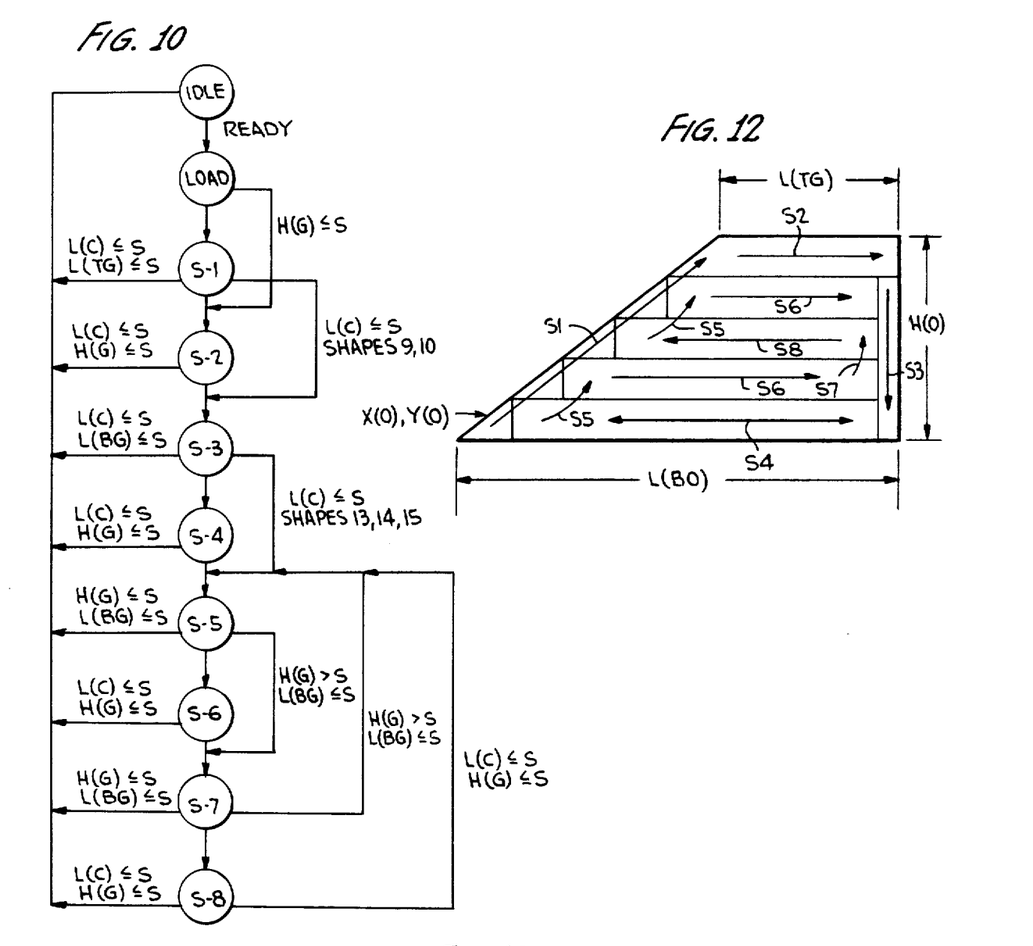
FIG. 10 is a state diagram for the side sequencer portion of the flash generator of FIG. 3.
FIG. 12 is a diagramatic illustration of the sequence in which flashes are generated to form a sample trapazoidal pattern in accordance with the present invention.

With reference to FIG. 12, it is noted that the four sides of the x-oriented pattern are numbered S1, S2, S3 and S4, the numbers representing the sequence in which the sides are formed by the beam under the control of the flash generator. For x-orientation, the sequence of side numbers is always clockwise from the reference corner. The triangle is considered as a degenerate form of the four-sided figure in which one side is set to zero length. In order to determine the triangle side numbering sequence, note that, as described above, each triangle must have one side parallel to the x-axis for x-orientation. Likewise, one apex must be opposite this side. If the apex is above the parallel side, then S2 is set to zero length and the numbering sequence becomes S1, S3, S4. If the apex is below the parallel side, S4 is set to zero length and the numbering sequence becomes S1, S2 and S3. For y-orientation a similar concept is used with the sequence of side numbers always being counterclockwise from the reference corner.

The fifteen possible shapes for x-orientation are as follows, with all orientations being referenced to the x-axis: (1) S2 and S4 parallel, S1 perpendicular and S3 at an angle of one hundred and thirty-five degrees; (2) S2 and S4 parallel, S3 perpendicular and S1 at an angle of forty-five degrees; (3) S2 and S4 parallel, S1 at an angle of forty-five degrees and S3 at an angle of one hundred and thirty-five degrees; (4) S2 and S4 parallel, S1 and S3 perpendicular; (5) S2 and S4 parallel, S1 perpendicular and S3 at forty-five degree angle; (6) S2 and S4 parallel, S1 at one hundred and thirty-five degree angle and S3 perpendicular; (7) S2 and S4 parallel, S1 at one hundred and thirty-five degree angle and S3 at forty-five degree angle; (8) S2 and S4 parallel, S1 and S3 each at one hundred and thirty-five degree angles; (9) S1 perpendicular, S2=zero, S3 at one hundred and thirty-five degree angle and S4 parallel, (10) S1 at forty-five degree angle, S2=zero, S3 perpendicular, S4 parallel; (11) S1 at forty-five degree angle, S2=zero, S3 at one hundred and thirty-five degree angle, S4 parallel; (12) S2 and S4 parallel, S1 and S3 at forty-five degree angles; (13) S1 perpendicular, S2 parallel, S3 at forty-five degree angle, S4=zero; (14) S1 at one hundred and thirty-five degree angle, S2 parallel, S3 perpendicular, S4=zero; (15) S1 at one hundred and thirty-five degree angle, S2 parallel, S3 at forty-five degree angle, S4=zero. The fifteen shapes obtainable for y-orientation are similar to those listed for x-orientation but rotated by ninety degrees so that the parallel, perpendicular and angular orientations are referenced to the y-axis.

The selected shapes are filled in by a shaped beam spot which, in general terms may be referred to as rectangular or right triangular. For many applications the beam spot is a square (for example, on the order of 2.5 microns on each side). The dimensions and shape of the beam spot may be changed to meet particular design needs.

In order to provide an example of the manner in which a pattern can be written or traversed in the target plane, consider a beam spot of square configuration with each side having a dimension S. The simplest pattern to be considered is a rectangle which, for purposes of this example, is considered to have dimensions which are an integer multiple of the beam spot height and length S. In order to consider the procedure in filling in the desired rectangular pattern, it must first be noted that the beam spot has finite dimensions; that is, the beam spot, as defined for this example, is a square with each side having a length S. If the outside edges of the square beam spot are to follow the outline of the rectangular pattern to be written, then the center of the beam spot must trace a rectangle which is smaller than the outside dimensions of the desired final shape. For example, consider the rectangular pattern to be written as having outside dimensions determined by corners with the following co-ordinates: (x,y) at the intersections of side S1 and S4; (x,y+dy) at the intersections of side S1 and S2; (x+dx,y+dy) at the intersection of sides S2 and S3; (x+dx,y) at the intersection of sides S3 and S4. The center of the beam traverses a path which is always spaced by a distance S/2 inside the rectangular pattern from the outer periphery. Therefore, the co-ordinates of the corresponding locations for the beam center (i.e., corresponding to the points described above at the various side intersections) are therefore defined as: (x+S/2,y+S/2); (x+S/2,y+dy−S/2); (x+dx−S/2,y+dy−S/2); (x+dx−S/2,y+S/2).

With a definition of the co-ordiates at the corners of the rectangle defining the outer travel limits of the beam spot center, it is possible to define the actual path of the beam spot in traversing the rectangular pattern of the present example. Beam spot travel and beam exposure follow a series of steps, namely: (1) exposure at the initial position defined as x(0y(0); motion by one unit S, where S is the dimension of a side of the square beam spot; exposure at this new beam position; motion by another unit S; etc. The beam travels the paths in the direction and sequence illustrated in FIG. 12.

The dimensions of the pattern to be written will usually not be an integral multiple of the beam spot dimension S. Under such circumstances, and referring to FIG. 12, there are two possible situations to be noted, namely at the intersection of sides S1 and S2 and the intersection at the sides S2 and S3. If dy, shown in FIG. 12 as H(0), is an integral multiple of S, the last beam spot along S1 is a unit S; a similar condition exists for dx at side S2. This is the situation described in the example stated above. If, however, dy is not an integral multiple of S, the last beam spot along side S1 is less than a single unit S, a similar condition existing for dx at side S2. Under such circumstances, the y spot dimension is set to dy for the last beam spot along S1 and for all of S2, a similar condition exists for the x spot dimension for the last beam spot along S2 and for all of S3.

Figure 3:
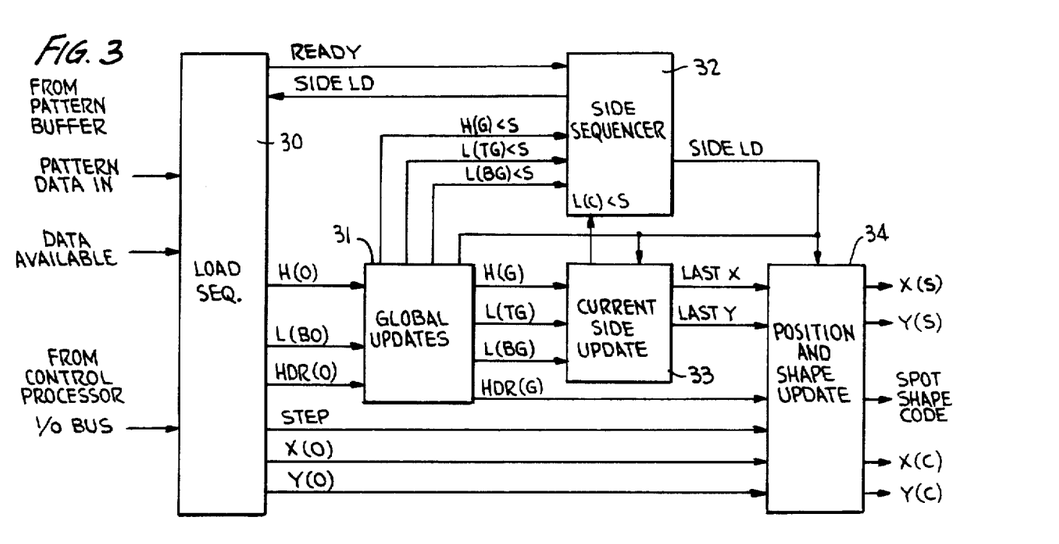
FIG. 3 is a functional block diagram of the flash generator portion of the pattern generator control unit of the present invention.

Referring again to the accompanying drawings, and particularly to FIG. 3 wherein the functional block diagram of the flash generator is illustrated, the flash generator is seen to be made up of five major modules, namely the load sequencer 30, the global update module 31, the side sequencer 32, the current side update module 33 and the position and shape update module 34. The following detailed description of these modules should be read with reference to FIG. 3 and to the figure pertaining specifically to the module being described.

Figure 4:
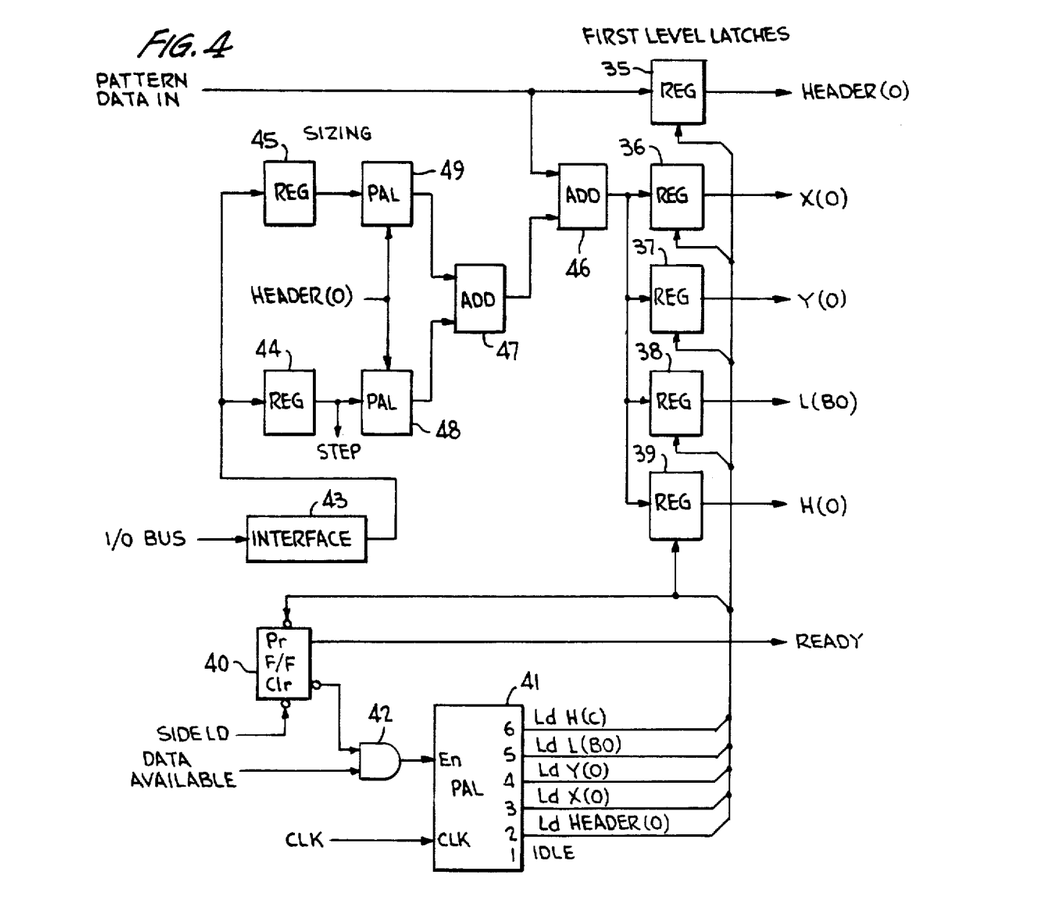
FIG. 4 is a functional block diagram of the load sequencer section of the flash generator of FIG. 3.
Figure 9:
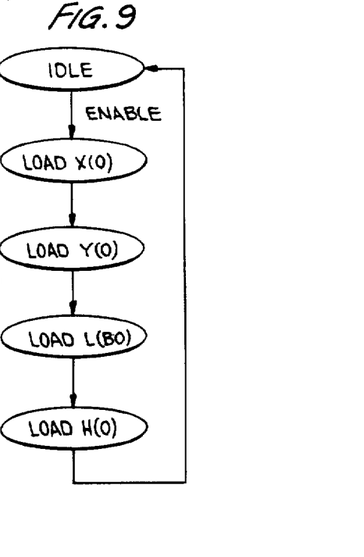
FIG. 9 is a state diagram for the load sequencer portion of the flash generator of FIG. 3.

The load sequencer is illustrated in greater detail in FIG. 4. The basic function of this module is to prepare data for the next feature to be exposed. This operation is performed in parallel with the exposure of a current feature, thereby saving processing time and speeding the time required to expose a complete pattern. The load sequencer 30 has a set of five registers 35, 36, 37, 38 and 39. These registers constitute first level latches for storing the parameters for the next feature to be written. These parameters are: Header, the position co-ordinates x(0) and y(0), the length of the bottom of the feature L(B0), and height H(0). Pattern data is received on the PATTERN DATA IN line and is accessed in word serial mode from a pattern data buffer 22 illustrated in FIG. 2. The load sequencer 30 must monitor the "DATA AVAILABLE" flag line from the pattern data buffer and, when the flag is active, the words defining the feature record must be fetched, loaded into the first level latches 35–39, and the READY flag must be set at flip flop 40. This function is implemented in a simple six-state sequencer programmable array logic element 41. The state diagram for the programmable array logic element 41 is illustrated in FIG. 9. The setting of the READY flag inhibits fetching the next feature record. Once the data in the first level latches 35–39 have been read into the second level latches (FIG. 5), the Side LD signal clears the READY flag and enables the load sequencer to fetch the next feature record by enabling and gate 42.

The load sequencer may also modify the initial position, length and height perameters in accordance with step and sizing values. The values for the step and sizing are downloaded from the pattern data control processor 24(FIG. 2) via the I/0 BUS and interface circuitry 43, and are stored in the step register 44 and sizing register 45. These values are normally set for an entire pattern exposure. The step value is required to modify the position co-ordinates, which initially define the corner of the feature, in order to define the center of the spot which exposes the corner. This involves adding or subtracting S/2 from the beam deflection position, depending upon the feature shape as defined in the Header. The sizing value is employed to shrink or expand the dimensions of the features. To shrink a feature the sizing value is added to the step correction at adder 47, the combined corrections then being added to the position co-ordinates at adder 46. The Header also defines internal versus external edges (i.e., abutting or non-abutting patterns) which can be used by the sizing logic to shrink or expand only external edges on the exposed pattern. The signed scaling for both the step and sizing corrections are implemented with respective programmable array logic elements 48 and 49.

In the preferred embodiment of the present invention, the first level latches 35–39 are model 74LS273 latches; the adders 46 and 47 are mode 74LS283 adders; the programmable array logic elements 48 and 49 are model PAL16L8A, and the programmable array logic element 41 is model PAL16RAA; flip flop 40 is a model 74LS74; and registers 44 and 45 are model 74LS273.

Figure 5:
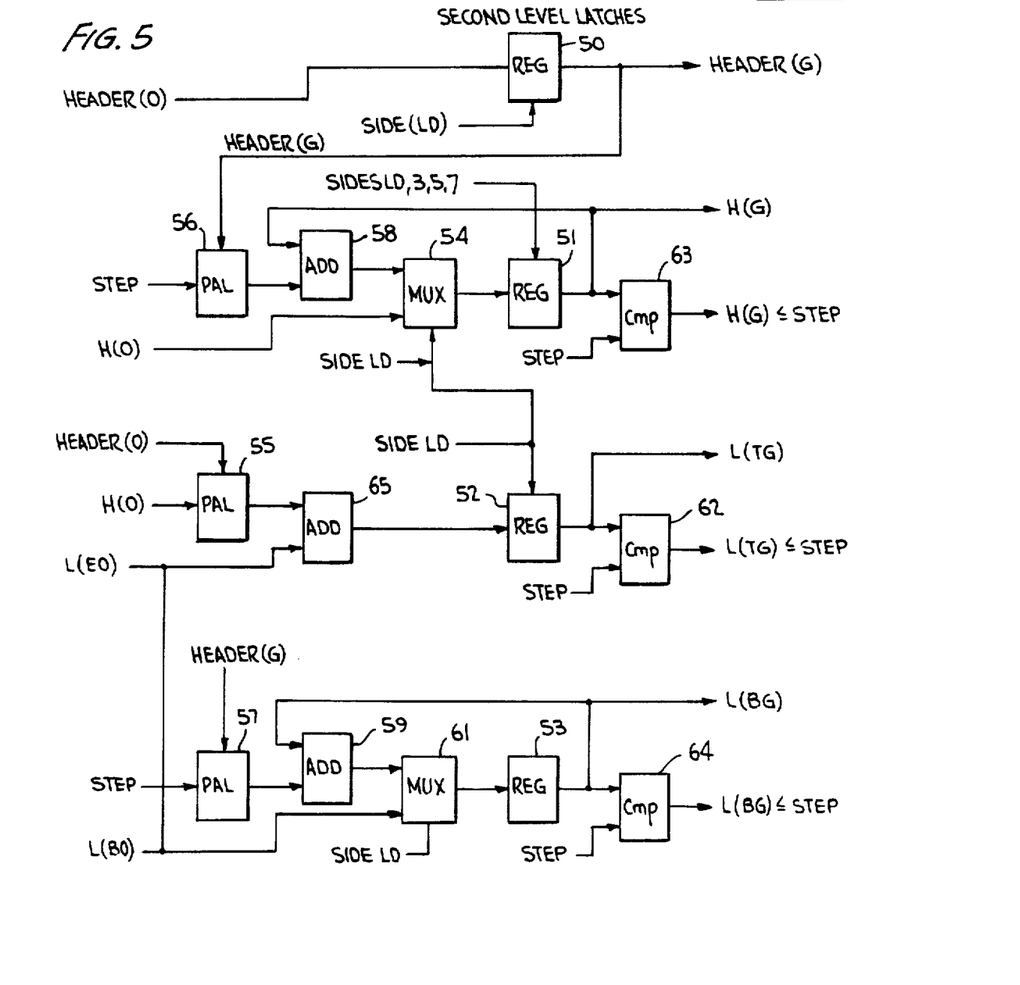
FIG. 5 is a functional block diagram of the global updates portion of the flash generator illustrated in FIG. 3.
Figure 6:
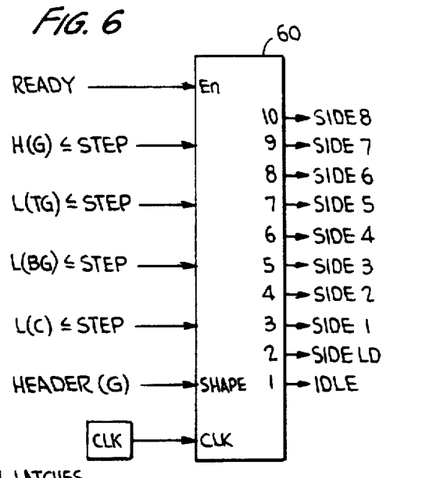
FIG. 6 is a functional block diagram of the side sequencer portion of the flash generator illustrated in FIG. 3.

The side sequencer 32, illustrated in detail in FIG. 6, co-ordinates the exposure of the feature, controlling the three remaining major modules, namely the global update module 31, the current side update module 33, and the position and shape update model 34. The side sequencer 32 monitors the READY flag, the remaining length of the current side, the global height, the length of the bottom and top of the feature, and the Header in order to determine which is the current side being exposed. The side sequencer is implemented as an eight-state PAL (programmable array logic element) for which the state diagram is illustrated in FIG. 10. In the preferred embodiment, the side sequencer PAL 60 is constituted by two model PAL 16R8A programmable array logic units. The PAL 60 is enabled when data is available in the first level latches 35–39 (FIG. 4), as indicated by the READY flag. The Side LD signal provides a single cycle state which transfers the feature data to the second level latches in the global update module 31 (FIG. 5) and clears the READY flag. The first flash is exposed as part of the LD state, not the first side. The side sequencer then selects either S1, if H(G) is greater than the step, or side S2 if H(G) is less than the step. The side sequencer continues to select a side until the length of the current side is less than or equal to the step side S. The global values for height, length of bottom and length of top are then monitored to determine which state to next select (i.e., a side or the idle state if the feature is completed).

The global update module 31 is illustrated in greater detail in FIG. 5 to which specific reference is now made. The function of this module is to maintain the remaining dimensions of the feature as the exposure proceeds. Upon actuation of the Side LD signal, applied to multiplexers 54 and 61 and to registers 50 and 52, the feature values are transferred to the second level latches including registers 50, 51, 52 and 53. The Header (0) signal is applied directly to the Header (0) register 50 in response to the Side LD signal going high. The H(0) or height signal is passed through multiplexer 54 to register 51. The L(0) or length signal passes through multiplexer 61 to register 53. The side sequencer 32 (illustrated in detail in FIG. 4) requires the length of the top of the feature which is calculated during the time that the Side LD signal is actuated. The length of the top is computed in accordance with the following equation: $L(TG)=L(B0)+S \times H(0)$, where S can have values of $-2, -1, 0, +1$, or $+2$, depending on the feature shape as defined by the Header (0) signal. The signed scaling is implemented in PAL's 55, 56 and 57.

Figure 11:
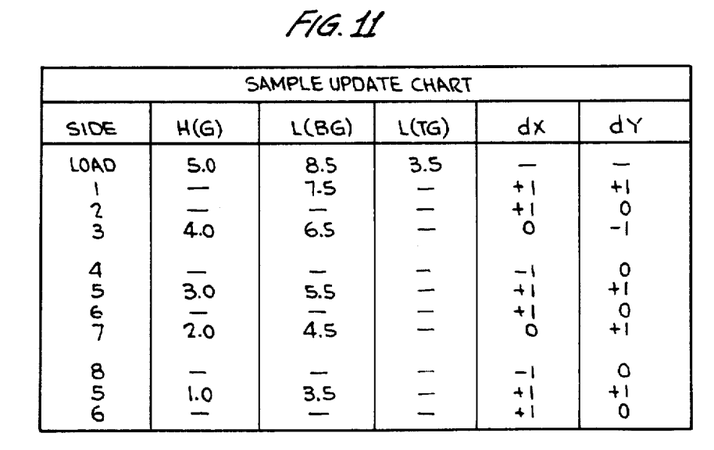
FIG. 11 is a sample update chart illustrating the conversion from a sample trapazoid to a beam flash in accordance with the present invention.

As the exposure of the feature procedes, the values of the global height and global bottom length are updated to indicate the remaining size of the feature (reference is made to the chart in FIG. 11). The update value is S multiplied by the Step, where S can be $-2, -1, 0, +1$, or $+2$, depending upon the feature shape as defined by the Header (G). In order to effect updating the H(G) signal is added to the step signal provided by PAL 56 at adder 58. The L(BG) signal is added to the step provided by PAL 57 at adder 59.

The global values are compared against the step value at comparators 62, 63 and 64. The comparisons are utilized by the side sequencer circuit (FIG. 4) at the end of the current side flash to determine which state to next select.

Figure 7:
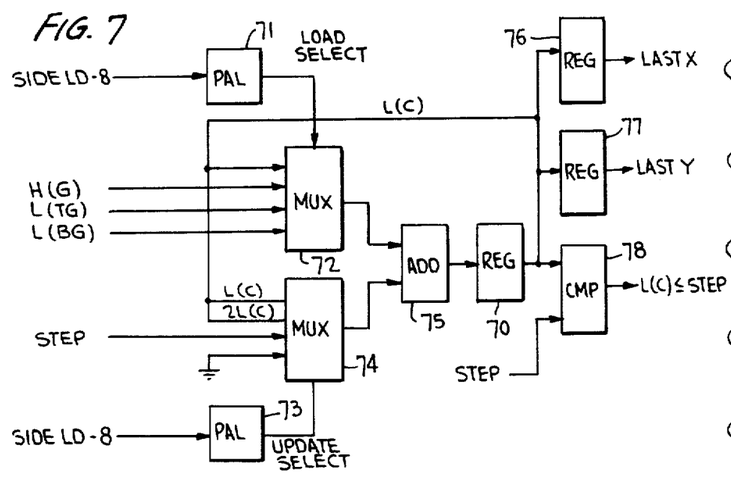
FIG. 7 is a functional block diagram of the current side update portion of the flash generator illustrated in FIG. 3.

The current side update module is illustrated in detail in FIG. 7 to which specific reference is now made. The function of the current side update module is to load the initial dimension for the next side, decrement the dimension for each step, and determine when the side is completed. The current side or L(C) register 70 is initialized at the last clock cycle for each side. During that cycle the load select PAL 71 selects either the H(G) signal or global height signal, the L(TG) or global top line length signal, or the L(BG) or global bottom length signal at multiplexer 72. The update select PAL 73 selects a modifier, either 0, $-$Step, $-L(C)$, or $-2L(C)$, which modifier is added to the load select value at adder 75 via multiplexer 74. The sum provided by adder 75 is latched into the L(C) register 70.

For each clock cycle during a side flash, the value in the L(C) register 70 is compared to the Step at comparator 78 which provides its output signal to the side sequencer circuit (FIG. 6). If the next step does complete the side, the next clock is determined to be the last cycle for that side and a new current dimension will be loaded. If the value in the L(C) register 70 is greater than the value of the Step, then the load select PAL 71 enables the L(C) signal at multiplexer 72, and the update select PAL enables the $-$Step signal at multiplexer 74 so that the value at the L(C) register will be decremented by the Step value at the next clock cycle.

The current side update module also latches the Last x (Sides S2, S4, S6, S8) and Last y (Sides S1, S3) values from the L(C) register at registers 76 and 77, respectively. These values are used to define the co-ordinates of the spot for the next side. It is to be noted from FIGS. 11 and 12 that the y dimension of side S2 is defined by the Last L(C) value from side S1; and the x dimension of side S3 is defined by the Last L(C) value from side S2.

Figure 8:
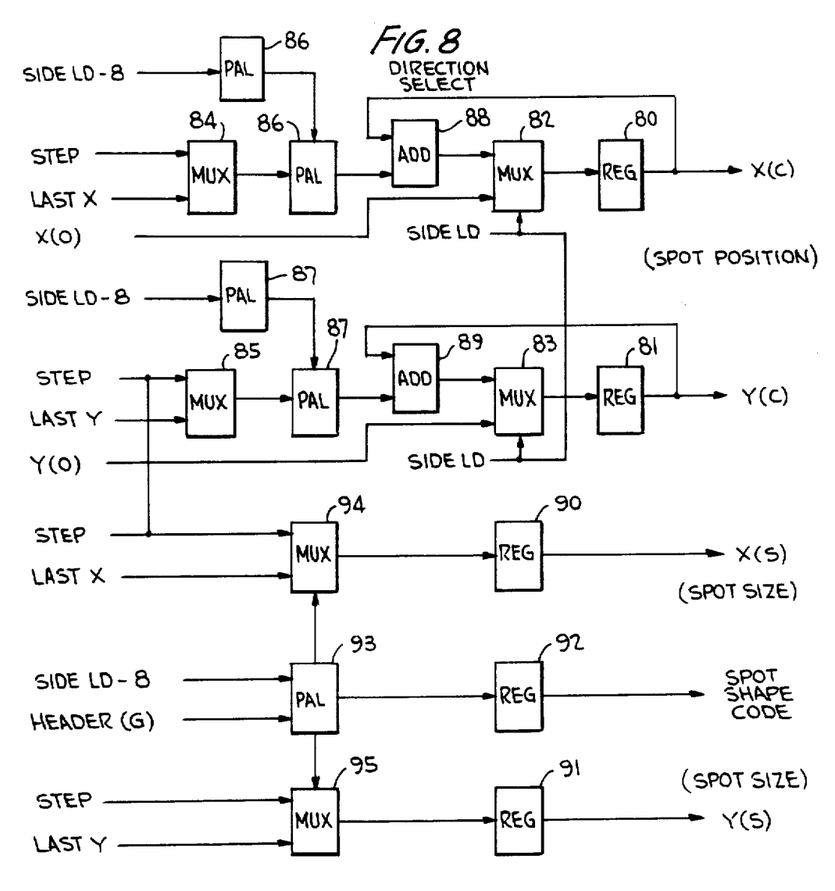
FIG. 8 is a functional block diagram of the spot position and shape update portion of the flash generator of FIG. 3.

The spot position and update module is illustrated in detail in FIG. 8 to which specific reference is now made. This module is required to maintain the appropriate position and shape for each flash.

The current spot position is defined by the x(C) and y(C) values in registers 80 and 81, respectively. These registers are initialized to the feature starting co-ordinates by the Side (LD) signal acting through multiplexers 82 and 83, respectively. Registers 80 and 81 are updated during each subsequent clock cycle. The update values may be −Step, 0 or +Step (or −Last,0, or +Last in certain cases, as controlled by respective multiplexers 84 and 85) depending on the current side. The direction select PAL's 86 and 87 decode the current side information to select the appropriate update values (dx and dy) for x and y. In this regard, reference is made to the chart of FIG. 11 for the condition when the Step is equal to 1. The updating is effected by addition of the update value to the x(C) and y(C) values at respective adders 88 and 89.

The current spot shape is defined by the current side along with the feature shape code in the Header (G) signal applied to the spot decode PAL 93. The spot shape code signal is stored in register 92. The current spot size is defined by the x(S) and y(S) signals stored in respective registers 90 and 91. The current spot size is either Step or Last L(C) value, as selected at respective multiplexers 94 and 95 by the spot decode PAL 93.

In the global update module circuit of FIG. 5, in a preferred embodiment of the invention, the PAL's 55, 56 and 57 may be model PAL 1628A; the adders 58, 59 and 65 may be model 74LS283; the multiplexers 54 and 61 may be model 74LS157; the registers 50, 51, 52 and 53 may be model 74LS273; and the comparators 62, 63 and 64 may be model 74AS885. In the current side update module of FIG. 7 the PAL's 71 and 73 may be model PAL16L8A; the multiplexers 72 and 74 may be model 74LS153; adder 75 may be model 74LS283; registers 70, 76 and 77 may be model 74LS273; and comparator 78 may be 74AS885. In the spot position and shape update module of FIG. 8 the multiplexers 84 and 85 may be model 74LS157; the PAL's 86, 87 and 93 may be model PAL16L8; the adders 88 and 89 may be model 74LS283; the multiplexers 82, 83 and 95 may be model 74LS157; and registers 80, 81, 90, 91 and 92 may be model 74LS273.

The invention as described above makes it possible to scan an electron beam to define a prescribed pattern with the beam spot in the target plane without requiring a raster scan of the entire target plane. The pattern is one of multiple patterns which can be identified by input data. The beam spot size and shape can be varied as required to most efficiently effect the scan of the desired pattern. Scanning procedes according to a predetermined format depending upon the input data relating to x-orientation and y-orientation. Quadrilaterals and triangles are included among the patterns which, in the disclosed embodiment, are limited to intersecting sides having angles of forty-five degrees, ninety degrees and one hundred and thirty-five degrees between them. It is to be understood, however, that the principles of the present invention permit intersecting sides to have a wider variety of angles between them. In addition, patterns other than or in addition to those described herein may be employed.

An important feature of the invention is that the process engineer in charge of an exposure operation is able to modify the width and length of the individual lines or flashes during pattern generation without changing the overall size of the pattern. In other words, the modification does not involve scaling the entire pattern; rather, it involves a narrowing or widening of the boundaries of each individual feature by appropriately changing the size and shape of the beam spot. As described above in relation to the circuit of FIG. 8, the sizing information is combined with the particular shape code to determine the appropriate sizing to be effected. For a rectangular pattern, for example, which does not abut another pattern, it may be desirable to size all four sides S1, S2, S3 and S4, constituting the boundaries of the rectangle; however, for a rectangle which abuts a neighboring pattern, sizing considerations may differ. Thus, selected edges of a pattern may be sized in accordance with particular considerations. The spot size registers 90, 91 contain the nominal spot size; that is, the largest rectangular spot size with which the system is working. This nominal spot size is modified in accordance with the particular selected pattern. In addition, the spot position is selected so that the center of the spot is moved inboard from the pattern periphery to accomodate the spot size.

The side sequencer, illustrated in detail in FIG. 6 looks at each trapazoid as a series of sides. Referring to FIG. 12, there are four outside boundaries S1, S2, S3 and S4 of a trapezoid. In addition, there are four types of interior "sides" or flashes S5, S6, S7 and S8. The outside boundaries are treated differently from the internal flashes. In effect, the interior strokes S5, S6, S7 and S8, follow a serpentine path from the bottom side to the top side. All of the interior strokes directed to the left and parallel to the x-axis are designated as S6 strokes; all of the strokes or flashes directed to the right and parallel to the x-axis are designated as S8 strokes; all of the interior strokes between the end of an S6 stroke and the beginning of an S8 stroke are designated as S5 strokes; and all of the strokes between the end of an S8 stroke and the start of and S5 stroke are designated as S7 strokes.

As noted above with relation to the load sequencer circuit illustrated in circuit 4, the pattern data control computer 24 of FIG. 2 provides information via interface 43 which permits the operator to set up parameters within the flash generator, namely the size of the step to be used, the particular features to be sized, etc. This information is stored in registers 44 and 45 for use at appropriate points during the generation of a pattern. The pattern data, defining the pattern shape, length, height and location in a target plane is latched in the Header register 35 and is also added to the appropriate sizing and shaping information at adder 46 to effect the appropriate modifications. For example, in applications wherein the beam is required to etch resist coatings, the etch procedure sometimes produces narrower or wider edge lines than intended. The sizing and shaping capability permits compensation for beam spread and other effects of the beam. The operator is thus able to control the magnification of the width of the lines formed in each flash. Thus, the starting co-ordinates x(0),y(0), the length of the bottom line L(B0) and the pattern height H(0) are stored in modified form in registers 36, 37, 38, 39 respectively, the modifications being effected in accordance with the sizing and step modifications introduced by the operator. The data from these registers is used to generate an address for each flash to be exposed in the selected pattern.

The length and height parameters determine how many steps S5 through S8 are required to fully expose the interior of the pattern (i.e., much like a paint brush used to fill in the interior). The original length and height provided by the input data is used to produce the outline of the pattern. As each side is completed, a spot size dimension is subtracted from the global height and length to produce a new global height and length dimensions. This is effected in the global update module 31 illustrated in detail in FIG. 5. The data available flag in the circuit of FIG. 4 basically enables the flash generator to expose a target area through a particular lenslet in the system illustrated in FIG. 1. The system next fetches data on the PATTERN DATA IN line of FIG. 4 and each of the five data words are stored in their respective first level latches 35, 36, 37, 38 and 39. The READY flip flop 40 responds to the LD H(0) signal to provide the READY flag, and inhibit fetching new pattern data. The READY flag notifies the Side Sequencer 60 in the circuit of FIG. 6 that data is stored in the first level latches of FIG. 4 and, therefore, that the generator is ready for an exposure sequence. The data is loaded into the second level latches on the side LD state of the side sequencer to begin a pattern exposure process. In other words, the second level latches are the working registers whereas the first level latches act as a buffer to permit a current exposure to proceed. Once the information has been loaded into the second latches, the first level latches are free to recieve new pattern information. The side LD signal clears the READY flip flop, which enables fetching the next pattern data in the first level latches. The data are modified as indicated above at adders 58, 59 and 65 for spot size and shape under the control of the PAL's 55,56 and 57. It is the modified data that is stored in the second level latches 50, 51, 52 and 53.

The side sequencer 32 waits in the idle mode until the ready flag is set; thereafter the side sequencer begins its sequencial stepping operation. The side sequencer basically looks at each pattern as a series of sides, namely the sides S1 through S8 described in detail below. Sides S1 through S4, the external boundaries of the pattern, are initially formed; thereafter, S5 to S8 are formed and may be repeated as many times as necessary to fill in the interior of the pattern. There are a number of sub-states used by the side sequencer to implement this procedure. The first sub-state involves a load instruction which moves data from the first level latches to the second level latches. The height of the pattern, the length of the bottom of the pattern and the Header defining the pattern shape are combined to permit calculation of the length of the top of the pattern. The side sequencer operates with the current side update logic at side S1 to load the height value from register 51 into the current side update register 70. After the number of beam deflection steps required to expose the stored height are completed, the L(TG) signal is loaded into the current side register 70. This value remains in register 70 until side S2 is completed, thereafter, the height parameter is loaded into register 70 while side S3 is exposed. Finally, the bottom length signal L(BG) is loaded into the current side register 70 to complete the circumscribing of the pattern. In order to expose sides S5 through S8, it is noted that sides S5 and S7 are always one step increments, a step being the width of the beam spot. In addition, loading is effected from the L(BG) register 53 repetitively to complete the exposure for sides S6 and S8, repeated as necessary to fill in the interior of the pattern. Therefore, the current side update is basically a decrement compare and decrement sequence of logic operations. In parallel with this operation, the system monitors the height and length of bottom, parameters as the process proceeds. In the trap zoid of FIG. 11 it can be seen that one must modify the height and bottom length parameters as the steps S5 through S8 are completed. The two registers involved, namely second level registers 51 and 53 are connected in a feedback arrangement with respective adders 58 and 59 so that spot size can be added and/or subtracted from the current value of the length or height. This procedure ocurrs in parallel with the current side updating with all of the procedures ocurring in real time at each step. The current side determines the direction for each step and the size of the step. The height and length update data determines, for the first step on each side, whether or not to modify the current length and height. For each step along any of the sides, therefore, the current side updates are interpreted in accordance with which side is being exposed and from the shape code. The spot position and shape module 34, illustrated in detail in FIG. 8, determines the current position of x and y and maintains a dynamically updated value for the co-ordinates of the beam. That updated value is used by the deflection system to control the beam position.

Having described several embodiments of a pattern unwinder according to the present invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

what is claimed is:

1. A method of exposing a predetermined pattern at a target plane to an electron beam that is momentarily flashed on at each of plural exposure locations within the predetermined pattern until the predetermined pattern is entirely exposed, said method comprising the steps of:
   (a) storing pattern data representing said predetermined pattern, said pattern data specifying the location, size and shape of the predetermined pattern on the target plane;
   (b) in response to the pattern data for said predetermined pattern, determining the beam spot sizes, shaped and exposure locations on the target plane required to expose the predetermined pattern;
   (c) sequentially deflecting the electron beam to each of said exposure locations in turn; and
   (d) at each exposure location attained in step (c), momentarily exposing the beam on said target surface and shaping the beam top expose only the beam spot shape determined in step (b) for that exposure location.

2. The method according to claim 1 wherein step (b) includes the step of minimizing the number of exposure locations required to expose the predetermined pattern by determining the maximum permissible beam spot size that can be exposed at each exposure location.

3. The method according to claim 2 wherein step (a) includes the steps of:
   - (a.1) specifying the location of said predetermined pattern as the coordinates on the target plane of a reference point in the predetermined pattern;
   - (a.2) specifying the shape of the predetermined pattern as a code identifying one of several permissible pattern shapes; and
   - (a.3) specifying the size of the predetermined pattern as first and second pattern dimensions in the target plane.

4. The method according to claim 3 wherein step (d) includes the step of shaping the beam, for each momentary beam exposure, to alternatively define triangular and rectangular beam profiles.

5. The method according to claim 3 wherein step (c) comprises the steps of:
   - (c.1) initially deflecting the electron beam to a reference location along the border of the predetermined pattern;
   - (c.2) deflecting the beam to successive adjacent locations along the border of the predetermined pattern until the entire border of the predetermined pattern has been exposed; and
   - (c.3) after the border of the predetermined pattern has been exposed, deflecting the beam to successive adjacent locations within the border in accordance with a prescribed sequential directional protocol until the entire prescribed pattern has been exposed;
   and wherein step (d) includes the steps of momentarily exposing the beam on said target surface at each of the deflected locations of steps (c.1), (c.2), and (c.3).

6. The method according to claim 5 wherein step (b) comprises the step of establishing the size of said beam spot as first and second beam spot dimensions in accordance with said first and second pattern dimensions, respectively.

7. The method according to claim 5 wherein the shape and size of the beam are adjustable at each individual exposure location attained in step (c).

8. The method according to claim 3 wherein step (b) comprises the step of establishing the size of said beam spot as first and second beam spot dimensions in accordance with the first and second pattern dimensions, respectively.

9. The method according to claim 1 wherein step (c) comprises the steps of:
   - (c.1) initially deflecting the electron beam to a reference location along the border of the predetermined pattern;
   - (c.2) deflecting the beam to successive adjacent locations along the border of the predetermined pattern until the entire border of the predetermined pattern has been exposed; and
   - (c.3) after the order of the predetermined pattern has been exposed, deflecting the beam to successive adjacent locations within the border in accordance with a prescribed sequential directional protocol until the entire prescribed pattern has been exposed;
   and wherein step (d) includes the steps of momentarily exposing the beam on said target surface at each of the deflected locations of steps (c.1), (c.2), and (c.3).

10. The method according to claim 1 wherein the shape and size of the beam are adjustable at each individual exposure location attained in step (c).

11. Apparatus for exposing a predetermined pattern in a target plane to an electron beams, said apparatus comprising:
   - selectively actuable flash generator means for momentarily emitting an electron beam generally toward said target plane;
   - storage means for storing pattern data representing the size, shape and location of said predetermined pattern on the target plane;
   - control means responsive to the stored pattern data for establishing beam spot sizes, shapes and exposure locations on the target plane required to expose the predetermined pattern;
   - deflection means for sequentially deflecting said beam to each of said exposure locations in turn;
   - actuator means for actuating said flash generator means momentarily at each of said exposure locations; and
   - shaping means for shaping the beam at each of said exposure locations in accordance with the beam spot shape established for that exposure location by said control means.

12. The apparatus according to claim 11 wherein step deflection means comprises:
   - means for initially deflecting the electron beam to a reference location along the border of the predetermined pattern;
   - means for deflecting the electron beam to successive adjacent locations along the bore of the predetermined pattern until the beam spot has been sequentially positioned along the entire border; and
   - means responsive to sequential positioning of the electron beam spot along the entire border for deflecting the electron beam to successive adjacent locations within the border in accordance with a prescribed sequential directional protocol until the electron beam spot has been positioned to fill in the entire predetermined pattern.

13. The apparatus according to claim 11 wherein said storage means includes means for storing said pattern data in a plurality of segments, a first of said segments specifying the location of the predetermined pattern as the coordinates on the target plane of a reference point in the predetermined pattern; a second of said segments specifying the shape of said predetermined pattern as a code representing one of several permissible pattern shapes, and a third of said segments specifying the size of said predetermined pattern as first and second pattern dimensions in the target plane.

14. The apparatus according to claim 13 wherein said control means comprises means for establishing the size of said beam spot as first and second beam spot dimensions as a function of said first and second pattern dimensions, respectively.

15. The apparatus according to claim 11 wherein said control means comprises means for minimizing the number of exposure locations required to expose the predetermined pattern in said target plane, said means for minimizing comprising means for determining the maximum permissible beam spot size that can be exposed at each of said exposure locations.

* * * * *

UNITED STATES PATENT AND TRADEMARK OFFICE
CERTIFICATE OF CORRECTION

PATENT NO. : 4,718,019
DATED : January 5, 1988
INVENTOR(S) : Timothy I. Fillion, et al It is certified that error appears in the above—identified patent and that said Letters Patent is hereby corrected as shown below:

Correct title to read "Electron Beam Exposure System And An Apparatus For Carrying Out A Pattern Unwinder".

Signed and Sealed this

Seventh Day of June, 1988

*Attest:*

DONALD J. QUIGG

*Attesting Officer*  *Commissioner of Patents and Trademarks*